(12) United States Patent
Lee et al.

(10) Patent No.: US 9,252,106 B2
(45) Date of Patent: Feb. 2, 2016

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Jeong-Kil Lee, Incheon (KR); Chan-Ho Park, Seongnam-si (KR); Nam-Ki Cho, Goyang-si (KR); Won-Sang Choi, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/454,432

(22) Filed: Aug. 7, 2014

(65) Prior Publication Data

US 2015/0044854 A1    Feb. 12, 2015

(30) Foreign Application Priority Data

Aug. 9, 2013 (KR) .................... 10-2013-0094979

(51) Int. Cl.
*H01L 23/02* (2006.01)
*H01L 23/544* (2006.01)
*H01L 21/762* (2006.01)
*H01L 21/283* (2006.01)

(52) U.S. Cl.
CPC ............ *H01L 23/544* (2013.01); *H01L 21/283* (2013.01); *H01L 21/76224* (2013.01); *H01L 2223/5446* (2013.01); *H01L 2223/54426* (2013.01); *H01L 2924/0002* (2013.01)

(58) Field of Classification Search
CPC ... H01L 23/485; H01L 23/522; H01L 23/544; H01L 23/562

USPC ............ 438/386, 401, 427; 257/E21.53, 536, 257/211
See application file for complete search history.

(56) References Cited

U.S. PATENT DOCUMENTS

| | | | |
|---|---|---|---|
| 6,037,236 A * | 3/2000 | Jang ............................. | 438/401 |
| 6,080,635 A * | 6/2000 | Jang et al. .................... | 438/401 |
| 6,114,215 A * | 9/2000 | Osugi et al. .................. | 438/401 |
| 6,214,703 B1 * | 4/2001 | Chen et al. ................... | 438/462 |
| 6,326,309 B2 * | 12/2001 | Hatanaka et al. ............. | 438/693 |
| 6,346,456 B2 * | 2/2002 | Chen ............................. | 438/401 |
| 6,528,386 B1 * | 3/2003 | Summerfelt et al. ......... | 438/401 |
| 6,767,800 B1 * | 7/2004 | Tsai et al. ..................... | 438/401 |
| 6,794,263 B1 * | 9/2004 | Lee et al. ...................... | 438/401 |
| 7,863,151 B2 | 1/2011 | Takei | |
| 8,399,340 B2 | 3/2013 | Ohi | |
| 2003/0102576 A1 * | 6/2003 | Teramoto ...................... | 257/797 |
| 2006/0076651 A1 * | 4/2006 | Tsutsue ......................... | 257/620 |
| 2008/0153249 A1 * | 6/2008 | Yang ............................. | 438/401 |

(Continued)

FOREIGN PATENT DOCUMENTS

| | | | |
|---|---|---|---|
| JP | 05-343319 A | 12/1993 | |
| JP | 2005-057142 A | 3/2005 | |

(Continued)

*Primary Examiner* — Michael Lebentritt
(74) *Attorney, Agent, or Firm* — McDermott Will & Emery LLP

(57) ABSTRACT

Provided is a method of fabricating a semiconductor device. The method of fabricating a semiconductor device includes preparing a substrate in which a scribe lane region and a chip region are defined, forming a trench in the scribe lane region of the substrate, forming a stopper layer in a part in the trench, and forming an alignment mark material on the stopper layer.

20 Claims, 16 Drawing Sheets

(56) References Cited

U.S. PATENT DOCUMENTS

| | | | |
|---|---|---|---|
| 2009/0134496 A1* | 5/2009 | Warrick et al. | 257/620 |
| 2010/0210088 A1* | 8/2010 | Ishimaru et al. | 438/401 |
| 2011/0117719 A1* | 5/2011 | Brown et al. | 438/401 |
| 2011/0156286 A1* | 6/2011 | Ushida et al. | 257/797 |
| 2011/0266032 A1* | 11/2011 | Xie et al. | 174/250 |
| 2011/0287617 A1* | 11/2011 | Kodama | 438/527 |
| 2011/0294278 A1* | 12/2011 | Eguchi et al. | 438/401 |
| 2012/0012843 A1* | 1/2012 | Matsubara | 257/48 |

FOREIGN PATENT DOCUMENTS

| | | |
|---|---|---|
| JP | 2005-072191 A | 3/2005 |
| JP | 2007-129115 A | 5/2007 |
| JP | 2008-130919 A | 6/2008 |
| KR | 10-1154205 B1 | 6/2012 |

* cited by examiner

A

1000

1100

1200

SEMICONDUCTOR DEVICE AND METHOD OF FABRICATING THE SAME

CROSS-REFERENCE TO RELATED APPLICATION

This application claims priority from Korean Patent Application No. 10-2013-0094979 filed on Aug. 9, 2013 in the Korean Intellectual Property Office, and all the benefits accruing therefrom under 35 U.S.C. §119, the contents of which in its entirety are herein incorporated by reference.

TECHNICAL FIELD

The present application relates to a semiconductor device and a method of fabricating the same.

BACKGROUND

In a process of fabricating a superjunction power device, a process using selective epitaxial growth which is advantageous in terms of cost has increased in recent years.

A planarizing process is required in a process of forming a deep trench, a process of forming an epitaxial layer in the deep trench by using the selective epitaxial growth, a process of forming an MOSFET structure on the epitaxial layer, and the like.

Further, in a postprocess, an alignment mark is used for accurate alignment during layer to layer matching; however, the alignment mark may be damaged by the planarizing process. Therefore, a technology of fabricating a semiconductor device is required so as to prevent the alignment mark from being damaged during the planarizing process.

SUMMARY

The present inventive concept has been made in an effort to provide a semiconductor device that prevents an alignment mark topology from being damaged during a planarizing process and prevents a defect from being transited to a substrate.

The present inventive concept has also been made in an effort to provide a method of fabricating the semiconductor device that prevents an alignment mark topology from being damaged in a planarizing process and prevents a defect from being transited to a substrate.

The effects of the present inventive concept are not limited to the aforementioned effects, and other effects, which are not mentioned above, will be apparently understood by the person skilled in the art from the recitations of the claims.

According to an aspect of the present inventive concept, there is provided a method of fabricating a semiconductor device. The method includes preparing a substrate in which a scribe lane region and a chip region are defined. A trench is formed in the scribe lane region of the substrate. A stopper layer is formed in a part in the trench. An alignment mark material is formed on the stopper layer.

According to another aspect of the present inventive concept, there is provided a method of fabricating a semiconductor device. The method includes preparing a substrate in which a scribe lane region and a chip region are defined. A first trench is formed in the scribe lane region of the substrate. A stopper layer is formed on a front surface of the substrate. An alignment mark material is formed on the stopper layer in the first trench. A second trench is formed by removing a part of the stopper layer and a part of the substrate formed in the chip region. The stopper layer and the alignment mark material which are formed higher than the top of the substrate are removed.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other features and advantages of the present inventive concept will become more apparent by describing in detail embodiments thereof with reference to the attached drawings in which.

DETAILED DESCRIPTION

Figure 1:
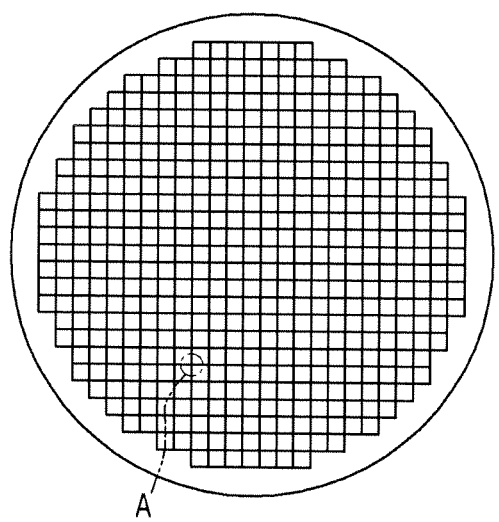
FIG. 1 illustrates a semiconductor wafer.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A semiconductor device and a method of fabricating the same which will be described below relate to a semiconductor device that prevents an alignment mark topology from being damaged during a planarizing process, and prevents a defect from being transited to a substrate in a postprocess, while fabricating a superjunction power device.

Figure 2:
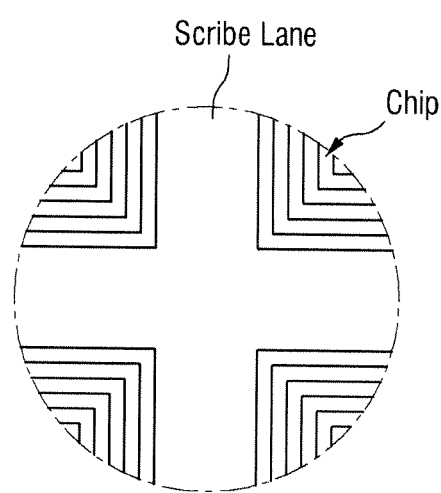
FIG. 2 is an enlarged view of area A of FIG. 1.
Figure 3:
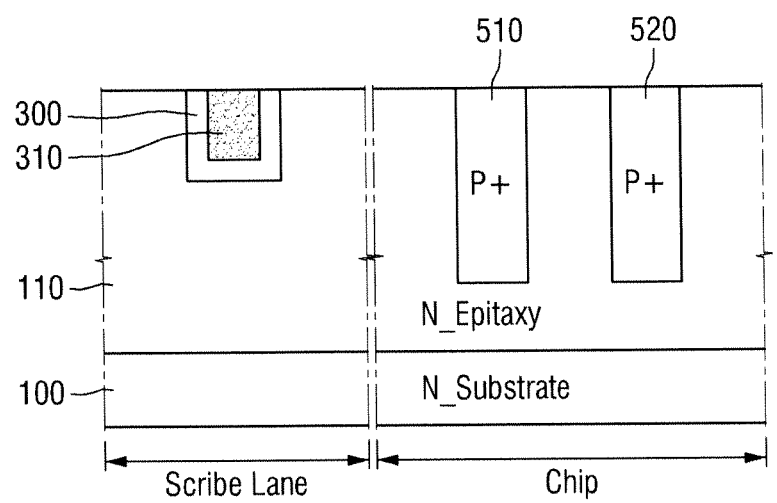
FIG. 3 is a diagram illustrating a semiconductor device according to an embodiment of the present inventive concept.

FIG. 1 illustrates a semiconductor wafer. FIG. 2 is an enlarged view of area A of FIG. 1. FIG. 3 is a diagram illustrating a semiconductor device according to an embodiment of the present inventive concept.

Referring to FIGS. 1 to 3, the semiconductor device according to the embodiment of the present inventive concept includes a substrate 100, a stopper layer 300, an alignment mark pattern 310, and conductive pillar structures 510 and 520.

FIG. 1 illustrates a semiconductor wafer 1 and FIG. 2 illustrates a scribe lane region and a chip region of the semiconductor wafer 1. The scribe lane region means a region in which the surface of the semiconductor wafer 1 is scuffed horizontally and vertically by a diamond cutter and the like in order to separate the semiconductor wafer 1 into a plurality of chips. The scribed semiconductor wafer 1 is rolled by a roller to be separated into the plurality of chips. Both the scribe lane region and the chip region are illustrated in FIG. 3.

The substrate 100 may be made of one or more semiconductor materials selected from the group consisting of Si, Ge, SiGe, GaP, GaAs, SiC, SiGeC, InAs, and InP. Further, the substrate 100 may be a rigid substrate such as a silicon substrate, a silicon on insulator (SOI) substrate, a gallium arsenide substrate, a silicon germanium substrate, a ceramic substrate, a quartz substrate, or a display glass substrate or a flexible plastic substrate such as polyimide, polyester, polycarbonate, polyethersulfone, polymethylmethacrylate, polyethylene naphthalate, or polyethyleneterephthalate.

In the substrate 100 of FIG. 3, the scribe lane region and the chip region are defined. The substrate 100 may be a first conductive (for example, N type) substrate, and the substrate 100 may be formed by growing a first conductive (for example, N type) epitaxial layer 110 and etching the epitaxial layer 110. Further, the substrate 100 may be formed by etching the first conductive (for example, N type) substrate itself.

A trench 200 (see FIG. 4) is formed in the scribe lane region of the substrate 100.

Figure 4:
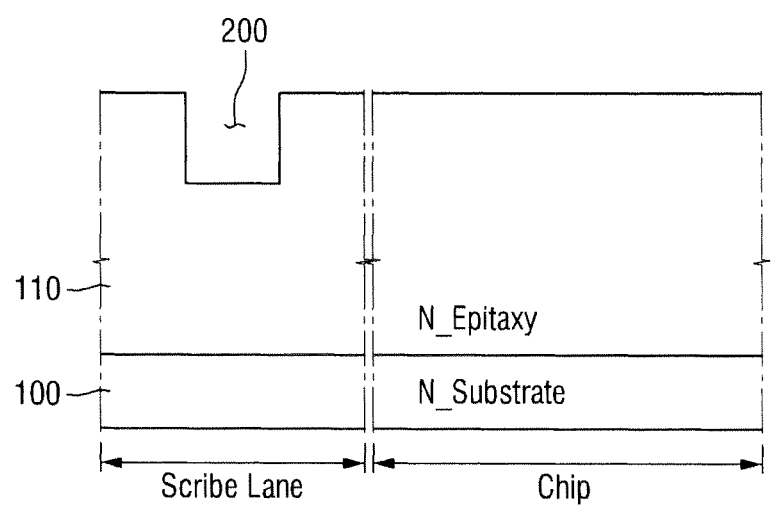
FIGS. 4 to 9 are diagrams illustrating intermediate steps for describing a method of fabricating a semiconductor device according to an embodiment of the present inventive concept.

The stopper layer 300 is formed to fill a part of the trench 200 (see FIG. 4). The stopper layer 300 may be, conformally formed in, for example, the trench 200 (see FIG. 4). The stopper layer 300 may serve to protect an alignment mark pattern 310 in the post planarizing process. That is, in the planarizing process, the planarizing process is performed up to the location of the top of the stopper layer 300, the planarizing process is further performed until the top of the substrate 100 is exposed, and the planarizing process is not performed any longer after the top of the substrate 100 is exposed, thereby protecting the alignment mark pattern 310. The stopper layer 300 may include an oxide film.

The alignment mark pattern 310 is formed on the stopper layer 300. In detail, when the stopper layer 300 is conformally formed in the trench 200 (see FIG. 4), the alignment mark pattern 310 may be formed to fill a remaining space in the trench 200 (see FIG. 4). The alignment mark pattern 310 may be used for layer to layer matching. The top of the alignment mark pattern 310 may be formed to have the same height as the top of the stopper layer 300. For example, when the stopper layer 300 is conformally formed in the trench 200 (see FIG. 4) and then is planarized to be formed in the trench 200 (see FIG. 4) in a U shape, an end portion (uppermost surface of the stopper layer 300) of the U shape and the top of the alignment mark pattern 310 may have the same height. The alignment mark pattern 310 may contain a polycrystalline material. For example, the polycrystalline material may be polysilicon.

The conductive pillar structures 510 and 520 are formed in the chip region. The conductive pillar structures 510 and 520 may be formed by forming trenches 501 and 502 (see FIG. 8) in the chip region and then filling the trenches 501 and 502 (see FIG. 8) with a conductive material. The conductive material may be a second conductive (for example, P type) material. The conductive material may be a silicon-based material such as polysilicon doped with second conductive (for example, P type) impurities and a metallic material such as metal silicide.

Hereinafter, a method of fabricating a semiconductor device according to an embodiment of the present inventive concept will be described.

FIGS. 4 to 9 are diagrams illustrating intermediate steps for describing a method of fabricating a semiconductor device according to an embodiment of the present inventive concept.

Referring to FIG. 4, first, a substrate 100 in which a scribe lane region and a chip region are defined is prepared and a trench 200 is formed in the scribe lane region of the substrate 100.

The substrate 100 may be made of one or more semiconductor materials selected from the group consisting of Si, Ge, SiGe, GaP, GaAs, SiC, SiGeC, InAs, and InP. Further, the substrate 100 may be a rigid substrate such as a silicon substrate, a silicon on insulator (SOI) substrate, a gallium arsenide substrate, a silicon germanium substrate, a ceramic substrate, a quartz substrate, or a display glass substrate or a flexible plastic substrate such as polyimide, polyester, polycarbonate, polyethersulfone, polymethylmethacrylate, polyethylene naphthalate, or polyethyleneterephthalate.

In the substrate 100, the scribe lane region and the chip region are defined. The substrate 100 may be a first conductive (for example, N type) substrate, and the substrate 100 may be formed by growing a first conductive (for example, N type) epitaxial layer 110 and etching the epitaxial layer 110. Further, the substrate 100 may be formed by etching the first conductive (for example, N type) substrate itself.

The trench 200 is formed in the scribe lane region of the substrate 100 and the trench 200 is formed in a region where an alignment mark pattern 310 is to be positioned in a post-process. FIG. 4 illustrates that the trench 200 has a vertical side wall, but the trench 200 is not limited thereto and may be formed to have an inclined side wall.

Figure 5:
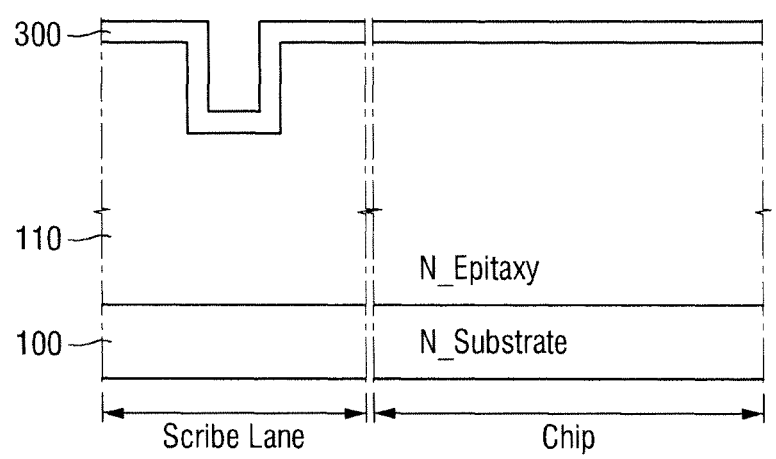

Subsequently, referring to FIG. 5, a stopper layer 300 is formed in a part of the trench 200 (see FIG. 4). In detail, the stopper layer 300 is formed to cover a front surface of the substrate 100 to fill a partial space in the trench 200 (see FIG. 4). When the stopper layer 300 is formed to fill the partial space in the trench 200 (see FIG. 4), the stopper layer 300 may be deposited to conformally cover the trench 200 (see FIG. 4). The stopper layer 300 may include an oxide.

Figure 6:
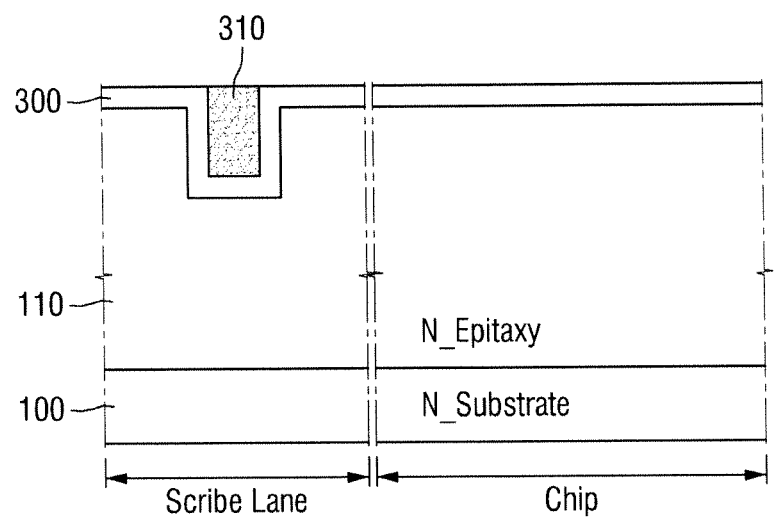

Subsequently, referring to FIG. 6, the alignment mark pattern 310 is formed on the stopper layer 300. The stopper layer 300 is deposited on a front surface of the substrate 100, and then an alignment mark material is deposited on the stopper layer 300 and a portion of the alignment mark material is removed to form the alignment mark pattern 310. A planarizing process may be used in order to remove a portion of the alignment mark material. The alignment mark material may be a polycrystalline material. For example, the polycrystalline material may be polysilicon.

Figure 7:
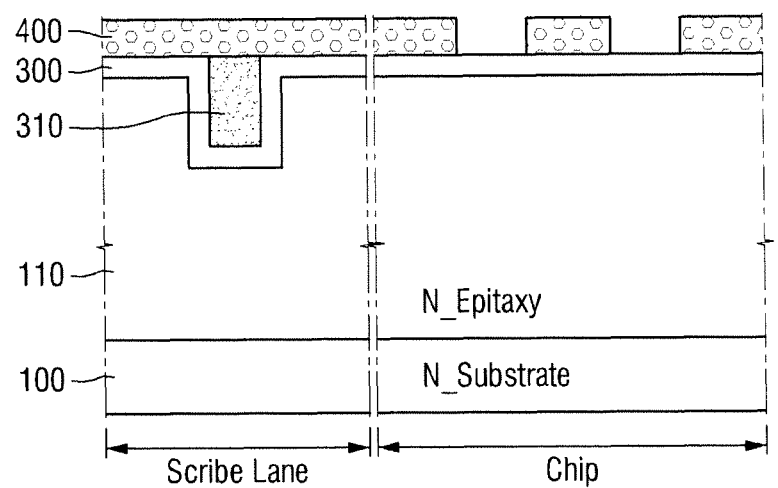

Subsequently, referring to FIG. 7, a mask pattern 400 is formed to cover a region other than a region where conductive pillar structures 510 and 520 (see FIG. 3) are to be formed. The mask pattern 400 is formed on the stopper layer 300.

Figure 8:
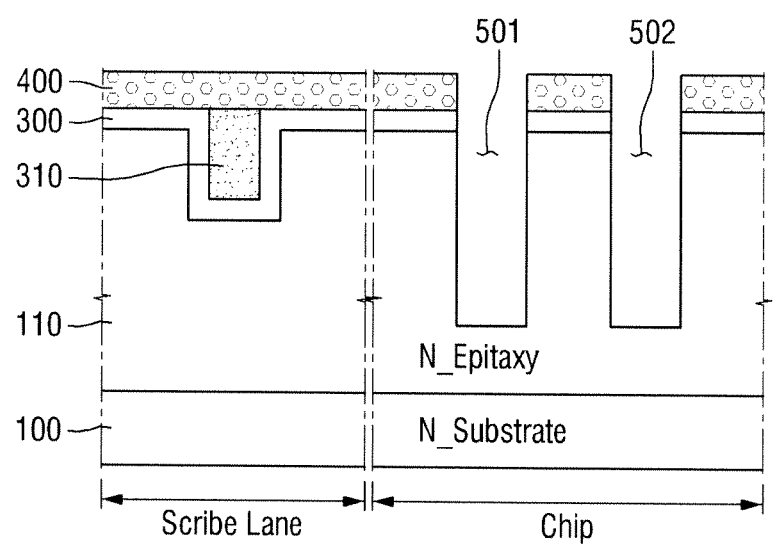

Subsequently, referring to FIG. 8, trenches 501 and 502 are formed in the chip region by using the mask pattern 400. The trenches 501 and 502 are formed at a location where the conductive pillar structures 510 and 520 are to be formed.

Figure 9:
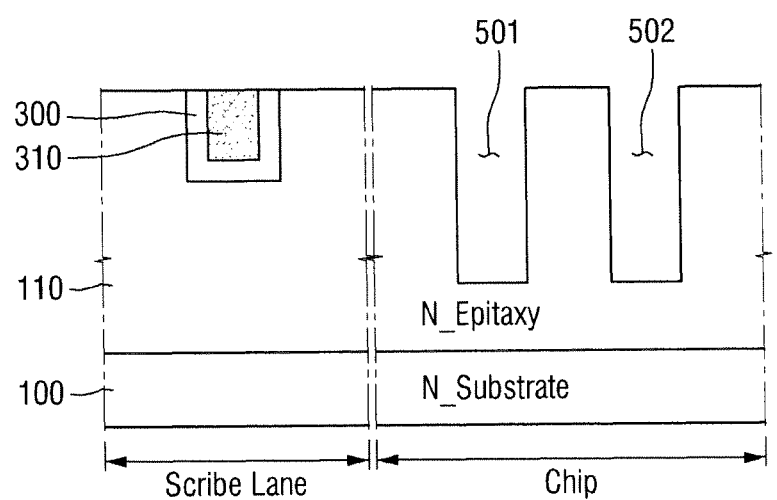

Subsequently, referring to FIG. 9, the mask pattern 400 is removed and the stopper layer 300 and the alignment mark material, which are formed higher than the top of the substrate 100, are removed to form the alignment mark pattern 310. A portion of the stopper layer 300 and the alignment mark material may be removed by an etching process such as a wet oxidation etching process. Further, a part of the stopper layer 300 and the alignment mark material may be removed by the planarizing process. For example, the planarizing process is performed until the top of the substrate 100 is exposed, and after the top of the substrate 100 is exposed, the planarizing process is stopped to form the alignment mark pattern 310.

Subsequently, referring to FIG. 3, the conductive pillar structures 510 and 520 are formed by filling the trenches 501 and 502 with the conductive material. The conductive material is deposited to fill the trenches 501 and 502, and then the conductive pillar structures 510 and 520 may be completed by using the planarizing process. In this case, a selective epitaxy growth method may be used to fill the trenches 501 and 502 with the conductive material. The conductive material may be a second conductive (for example, P-type) material. The conductive material may be a silicon-based material such as polysilicon doped with second conductive (for example, P-type) impurities and a metallic material such as metal silicide.

Figure 10:
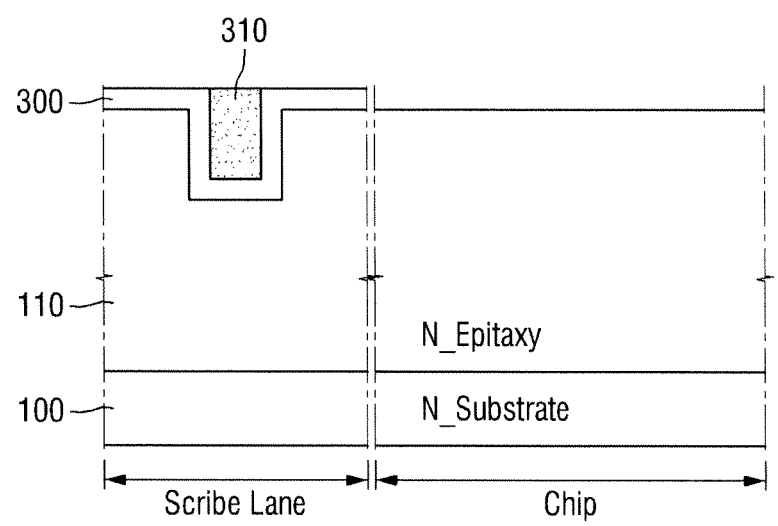
FIGS. 10 to 12 are diagrams illustrating intermediate steps for describing a method of fabricating a semiconductor device according to another embodiment of the present inventive concept.
Figure 11:
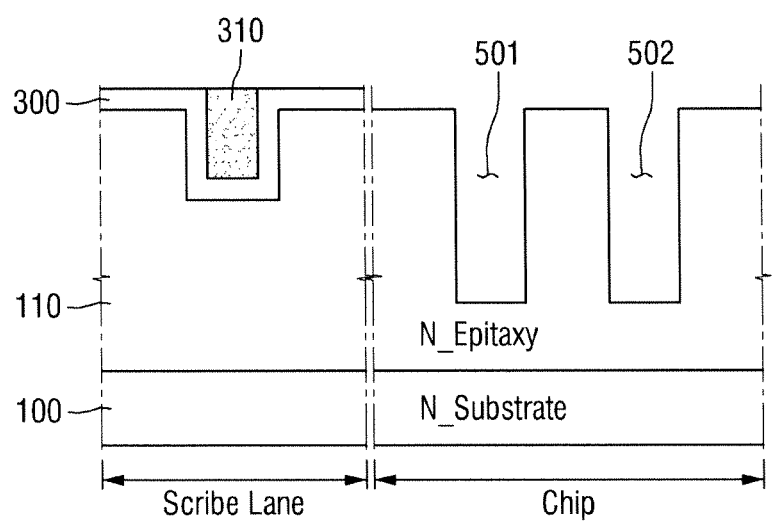
Figure 12:
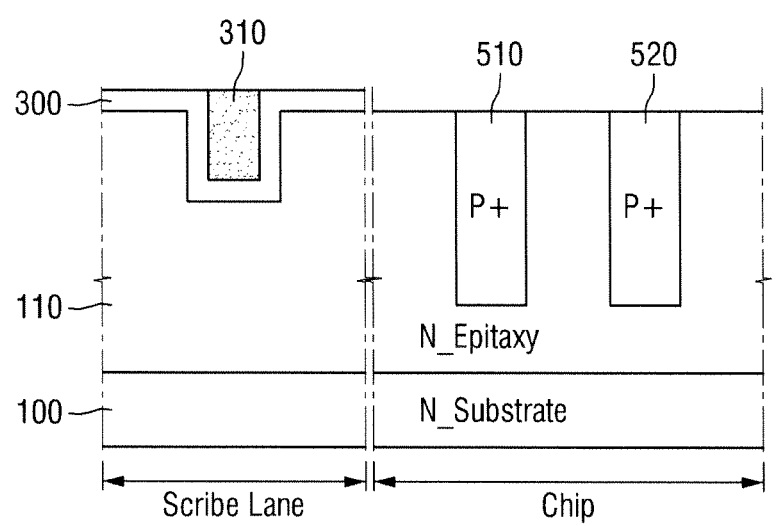

FIGS. 10 to 12 are diagrams illustrating intermediate steps for describing a method of fabricating a semiconductor device according to another embodiment of the present inventive concept. For convenience of description, a description of substantially the same parts as those described in the method of fabricating the semiconductor device according to the embodiment of the present inventive concept will be omitted.

Referring to FIG. 10, the stopper layer 300 is formed on only the scribe lane region of the substrate 100. That is, the stopper layer 300 is deposited on the front surface of the substrate 100, and then the stopper layer 300 formed in the chip region is removed by using a mask covering only the scribe lane region to form the stopper layer 300 on only the scribe lane region of the substrate 100. In this case, the stopper layer 300 may be conformally formed to cover the trench 200 (see FIG. 4) formed in the scribe lane region of the substrate 100. The alignment mark material is deposited on the stopper layer 300 and a portion of the alignment mark material is removed by using the planarizing process to form the alignment mark pattern 310.

Referring to FIG. 11, the trenches 501 and 502 are formed in the chip region of the substrate 100. The trenches 501 and 502 may be formed at locations where the conductive pillar structures 510 and 520 are to be formed.

Referring to FIG. 12, the conductive pillar structures 510 and 520 are formed by filling the trenches 501 and 502 with the conductive material. The conductive material is deposited to fill the trenches 501 and 502, and then the conductive pillar structures 510 and 520 may be completed by using the planarizing process. In this case, a selective epitaxy growth method may be used to fill the trenches 501 and 502 with the conductive material. The conductive material may be a second conductive (for example, P-type) material. The conductive material may be a silicon-based material such as polysilicon doped with second conductive (for example, P-type) impurities and a metallic material such as metal silicide.

As described above, when using the method of fabricating the semiconductor device according to some embodiments of the present inventive concept, alignment mark patterns 310 having various widths may be formed in the scribe lane region of the substrate 100 to have no step from the chip region. Further, since the conductive pillar structures 510 and 520 are formed in a state where the stopper layer 300 is not present in the chip region, the stopper layer 300 made of the oxide during selective epitaxy growth for forming the conductive pillar structures 510 and 520 may prevent a defect from being transited to the substrate 100. Since the defect of the substrate 100 may cause current leakage, a process for preventing the defect of the substrate 100 is required.

Next, referring to FIG. 13, an electronic system which may adopt the semiconductor device according to the embodiments of the present inventive concept will be described.

Figure 13:
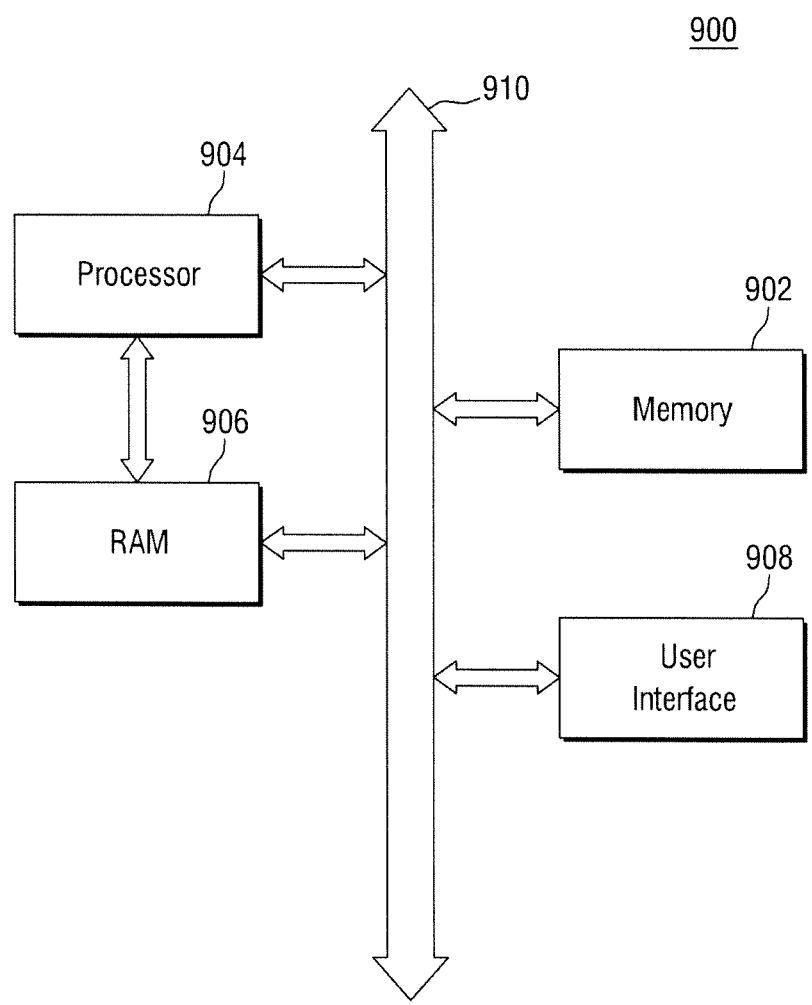
FIG. 13 is a block diagram illustrating a configuration of an electronic system which may adopt the semiconductor device according to the embodiments of the present inventive concept.

FIG. 13 is a block diagram illustrating a configuration of an electronic system which may adopt the semiconductor device according to the embodiments of the present inventive concept.

Referring to FIG. 13, an electronic system 900 may include a memory system 902, a processor 904, a RAM 906, and a user interface 908.

The memory system 902, the processor 904, the RAM 906, and the user interface 908 may communicate data with each other by using a bus 910.

The processor 904 may serve to execute a program and control the electronic system 900, and include at least one microprocessor, a digital signal processor, a microcontroller, and at least one of logic elements that may perform similar functions thereto.

The RAM 906 may be used as an operating memory of the processor 904. The RAM 906 may be configured by, for example, a volatile memory such as a DRAM, and in this case, the aforementioned semiconductor memory devices may be adopted herein. Meanwhile, the processor 904 and the RAM 906 may be implemented by one semiconductor device or by being packaged as a semiconductor package.

The user interface 908 may be used to input or output data into or to the electronic system 900. Examples of the user interface 908 may include a key pad, a keyboard, an image sensor, and a display device.

The memory system 902 may store a code for an operation of the processor 904, data processed by the processor 904, or data input from the outside. The memory system 902 may include a separate controller for driving and may be configured to additionally include an error correction block. The error correction block may be configured to detect and correct an error of data stored in the memory system 902 by using an error correction code (ECC).

Meanwhile, in an information processing system such as a mobile apparatus or a desktop computer, a flash memory may be mounted as the memory system 902. The flash memory may be configured by a solid state drive (SSD). In this case, the electronic system 900 may stably store large-capacity data in the flash memory.

The memory system 902 may be integrated in one semiconductor memory device. For example, the memory system 902 is integrated in one semiconductor memory device to configure a memory card. For example, the memory system 902 is integrated as one semiconductor memory device to configure a memory card, such as a PC card (personal computer memory card international association (PCMCIA)), a compact flash (CF) card, smart media cards (SM, and SMC), a memory stick, multimedia cards (MMC, RS-MMC, and MMCmicro), SD cards (SD, miniSD, microSD, and SDHC), and a universal flash storage (UFS).

Figure 14:
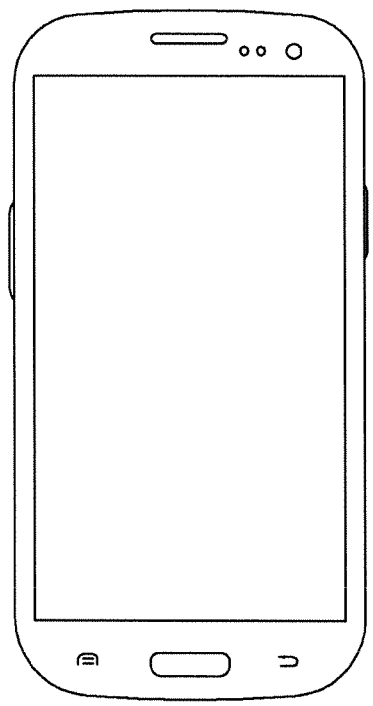
FIG. 14 is a diagram illustrating an example in which the electronic system of FIG. 13 is applied to a smart phone.

The electronic system 900 illustrated in FIG. 13 may be applied to electronic control devices of various electronic apparatuses. FIG. 14 is a diagram illustrating an example in which the electronic system of FIG. 13 is applied to a smart phone. When the electronic system 900 of FIG. 13 is applied to a smart phone 1000, the electronic system 900 of FIG. 13 may be adopted as a partial component of an application processor.

Figure 15:
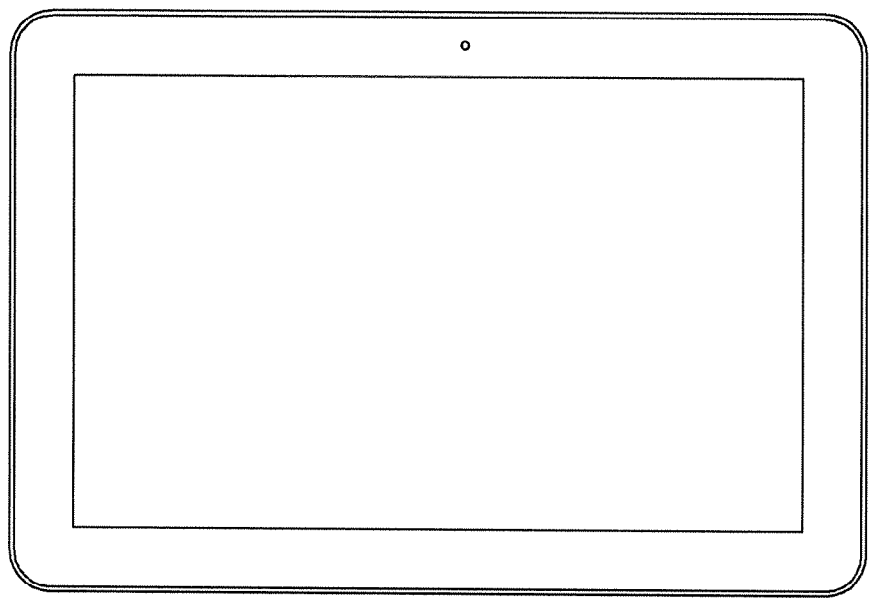
FIG. 15 is a diagram illustrating an example in which the electronic system of FIG. 13 is applied to a tablet PC.
Figure 16:
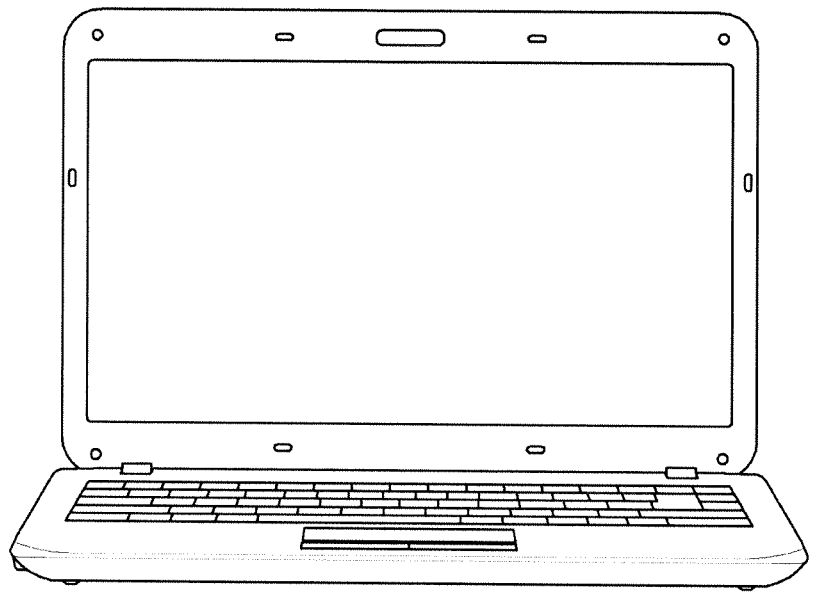
FIG. 16 is a diagram illustrating an example in which the electronic system of FIG. 13 is applied to a notebook.

Meanwhile, the electronic system 900 of FIG. 13 may also be adopted in various other electronic apparatuses. FIG. 15 is a diagram illustrating an example in which the electronic system of FIG. 13 is applied to a tablet PC. FIG. 16 is a diagram illustrating an example in which the electronic system of FIG. 13 is applied to a notebook.

Further, the memory system 900 of FIG. 13 is provided as one of various constituent elements of an electronic device, such as a personal computer, an ultra mobile PC (UMPC), a workstation, a net-book computer, personal digital assistants (PDA), a portable computer, a web tablet PC, a wireless phone, a mobile phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various constituent elements configuring a computing system.

Meanwhile, when the electronic system 900 of FIG. 13 is equipment that may perform wireless communication, the electronic system 900 of FIG. 13 may be used in a communication systems such as a code division multiple access (CDMA), a global system for mobile communication (GSM), a north American digital cellular (NADC), an enhanced-time division multiple access (E-TDMA), a wideband code division multiple access (WCDAM), and a CDMA2000.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A method of fabricating a semiconductor device, the method comprising:
preparing a substrate to include both a scribe lane region and a chip region;
creating a trench in the scribe lane region of the substrate;
forming a stopper layer in a portion in the trench;
forming an alignment mark material on the stopper layer in the trench, the alignment mark material filling an entire portion of a remaining space in the trench; and removing the stopper layer and the alignment mark material which are formed on the chip region.

2. The method of claim 1, wherein in the forming of the stopper layer, the stopper layer is deposited only on the scribe lane region of the substrate.

3. The method of claim 2, further comprising:
removing the stopper layer and the alignment mark material which are formed higher than the top of the substrate.

4. The method of claim 2, wherein the forming the stopper layer includes:
depositing the stopper layer on a front surface of the substrate; and
removing the stopper layer formed on the chip region of the substrate.

5. The method of claim 2, wherein the forming the stopper layer includes:
depositing the stopper layer to conformally cover the trench.

6. The method of claim 5, wherein the forming the alignment mark material includes:
depositing the alignment mark material on the stopper layer; and
removing a portion of the alignment mark material by way of a planarizing process.

7. The method of claim 1, wherein the stopper layer includes an oxide.

8. The method of claim 1, wherein the alignment mark material is a polycrystalline material.

9. A method of fabricating a semiconductor device, the method comprising:
preparing a substrate to include both a scribe lane region and a chip region;
creating a first trench in the scribe lane region of the substrate;
forming a stopper layer on a front surface of the substrate;
forming an alignment mark material on the stopper layer in the first trench, the alignment mark material filling an entire portion of a remaining space in the first trench;
creating a second trench by removing a part of the stopper layer and a part of the substrate formed in the chip region; and
removing the stopper layer and the alignment mark material which are formed higher than the top of the substrate,
wherein the stopper layer and alignment mark material remain only on the scribe lane region of the substrate.

10. The method of claim 9, further comprising:
filling the second trench with a conductive material.

11. The method of claim 10, wherein the filling of the second trench includes:
filling the second trench with the conductive material by way of an epitaxy process.

12. The method of claim 9, wherein the forming of the stopper layer includes:
depositing the stopper layer on the front surface of the substrate to conformally cover the first trench.

13. The method of claim 12, wherein the forming of the alignment mark material includes:
depositing the alignment mark material on the stopper layer; and
removing a portion of the alignment mark material by way of a planarizing process.

14. The method of claim 9, wherein the stopper layer includes an oxide.

15. The method of claim 9, wherein the alignment mark material is a polycrystalline material.

16. A method of fabricating a semiconductor device, the method comprising:
creating a first trench in a scribe lane region of a substrate;
depositing a stopper layer on the substrate to conformally cover the first trench in the scribe lane region of the substrate and to cover a chip region of the substrate;
depositing an alignment mark material on the stopper layer in the first trench, the alignment mark material filling an entire portion of a remaining space in the first trench;
forming a mask pattern on the stopper layer and alignment mark material;
creating a second trench in the chip region of the substrate by using the mask pattern; and
depositing a conductive material in the second trench to form a conductive pillar structure.

17. The method of claim 16, wherein, prior to the step of depositing of the conductive material: removing the mask pattern, the stopper layer and the alignment mark material to expose an upper surface of the substrate.

18. The method of claim 16, wherein the stopper layer includes an oxide.

19. The method of claim 16, wherein the alignment mark material is a polycrystalline material.

20. The method of claim 16, wherein the conductive material is a doped silicon material.

* * * * *